United States Patent [19]
Weiller

[11] Patent Number: 5,763,007
[45] Date of Patent: Jun. 9, 1998

[54] METHOD OF CONTROLLING REACTIONS BETWEEN TETRAKIS DIALKYLAMINE TITANIUM AND AMMONIA FOR PRODUCING TITANIUM NITRIDE FILMS

[75] Inventor: Bruce H. Weiller, Santa Monica, Calif.

[73] Assignee: The Aerospace Corporation, El Segundo, Calif.

[21] Appl. No.: 673,703

[22] Filed: Jun. 25, 1996

[51] Int. Cl.$^6$ ............................................ C23C 16/34
[52] U.S. Cl. .................................. 427/248.1; 427/255.2
[58] Field of Search ............................. 427/255.2, 590, 427/99, 248.1; 423/409, 411; 556/56; 564/470

[56] References Cited

PUBLICATIONS

Weiller, Chem. Mater., vol. 6, No. 3, (1994) pp. 260–261 (no month).

Weiller, J. Am. Chem. Soc., 118, May, 1996, pp. 4975–4983.

Weiller, Chem. Mater., vol. 7, No. 9, Sep., 1995, pp. 1609–1611.

"Chemical Vapor Deposition of Titanium, Zirconium, and Hafnium Nitride Thin Films", R. Fox, R.G. Gordon, D.M. Hoffman American Chemical Society, pp. 1138–1148, 1991 (No Month).

"Flow Tube Kinetics of Gas-Phase CVD Reactions", B.H. Weiller Mat. Res. Soc. Symp., Proc., vol. 334, pp. 379–384, 1994 (no month).

"Low Temperature Metal–Organic Chemical Vapor Deposition of Advanced Barrier Layers for the Microelectronics Industry", I.J. Raijmakers Thin Solid Films, vol. 247, pp. 85–93, 1994 (no month).

Infrared Studies of the Surface & Gas Phase Reactions Leading to the Growth of Titanium Nitride Thin Films From Tetrakis (Dimethylamido) Titanium and Ammonia J. Electrochem. Soc., vol. 139, No. 12, pp. 3603–3609, Dec. 1992, Dubois et al.

"Investigations of the Growth of TiN Thin Films form Ti (NMe$_2$)$_4$ and Ammonia", J.A. Prybyla, C.M. Chiang., and L.H. Dubois J. Electorchem. Soc., vol. 140, No. 9, pp. 2695–2702 Sep. 1993.

Low Temperature CVD of TiN From Ti (NR$_2$)$_4$ and HN$_3$. FTIR Studies of the Gas-Phase Chemical Reactions, B. H. Weiller Mat. Res. Soc. Symp. Proc., vol. 335, pp. 159–164, 1994 (no month).

"Metalorganic Chemical Vapor Deposition of TiN Films for Advanced Metallization", G.S. Sandhu, S.G. Meikle, and T.T. Doan Appl. Phys. Lett., vol. 62, No. 3, pp. 240–242, Jan. 1993.

Flow–Tube Kinetics of Gas–Phase Chemical Vapor Deposition Reactions: TiN from Ti (NMe$_2$)$_4$ and HN$_3$., B.H. Weiller Chemical of Mat. vol. 6, pp. 260–261, 1994 (No Month).

"Metallo–Organic Compounds, Containing Metal–Nitrogen Bonds, Part I. Some Dialkylamino–Derivatives of Titanium and Zirconium", D.C. Bradley, I.M. Thomas J. Chem. Soc., pp. 3578–1861, 1960 (no month).

"Low Temperature Preparation of Gallium Nitride Thin Films", R.G. Gordon, D.M. Hoffman, and U. Riaz Mat. Res. Soc. Symp. Proc., vol. 242, pp. 445–450, 1992 (no month).

(List continued on next page.)

*Primary Examiner*—Shrive Beck
*Assistant Examiner*—Timothy Meeks
*Attorney, Agent, or Firm*—Derrick Michael Reid

[57] ABSTRACT

Chemical vapor deposition of titanium nitride thin films is based upon the gas phase kinetics of the reaction of a metal-amido precursors, e.g. tetrakis dimethylamido titanium (Ti(NMe$_2$)$_4$), which when reacted with a reagent, for example, NH$_3$ produces in a transamination reaction, an amine, e.g. HNMe$_2$, as a direct product, which when added to the reaction in excess, inhibits the reversible transamination reaction so as to slow and control the rate of reaction to produce titanium nitride films having conformal step coverage over sub-micron integrated circuit features.

4 Claims, 2 Drawing Sheets

OTHER PUBLICATIONS

"Low-Temperature Atmospheric Pressure Chemical Vapor Deposition of Polycrystalline Tin Nitride Thin Films", R.G. Gordon, D.M. Hoffman, and U. Riaz Chem. Mater. vol. 4, No. 1, pp.68–71, 1992 (no month).

"Chemical Vapor Deposition of Aluminum Nitride Thin Films", R.G. Gordon, U. Riaz, and D.M. Hoffman J. Mater. Res. vol. 7, No. 7, pp. 1679–1684, Jul. 1992.

"Chemical Vapor Deposition of Vanadium, Niobium and Tantalum Nitride Thin Films", R.M. Fix, R.G. Gordon, and D.M. Hoffman Chem. Mater. vol. 5, pp. 614–619, 1993 (no month).

TiN Thin Film Deposition System

Logarithmic Normalized Absorbance of TDMAT Ti(N(CH$_3$)$_2$)$_4$

METHOD OF CONTROLLING REACTIONS BETWEEN TETRAKIS DIALKYLAMINE TITANIUM AND AMMONIA FOR PRODUCING TITANIUM NITRIDE FILMS

STATEMENT OF GOVERNMENT INTEREST

The invention was made with Government support under Contract No. F04701-93-C-0094 by the Department of the Air Force. The Government has certain rights in the invention.

The invention described herein may be manufactured and used by and for the government of the United States for governmental purpose without payment of royalty therefor.

FIELD OF THE INVENTION

The present invention relates to the field of reversible transamination reactions, such as those used during the chemical vapor deposition of thin films on silicon based integrated circuits. More particularly, the present invention relates to metal-amido precursor and amine reagent reversible transamination reactions having dialkylamine products that can be used to inhibit the reaction rate to the control the rate of production and properties of thin film materials.

BACKGROUND OF THE INVENTION

Titanium nitride (TiN) is a material with a unique combination of properties including high hardness, good electrical conductivity, high melting point and chemical inertness. This makes it useful for many applications such as wear resistant coatings on machine tools and bearings, thermal control coatings for windows and erosion resistant coatings for spacecraft plasma probes. However, one of the most important advanced applications of TiN is as a diffusion barrier layer for metalization in integrated circuits. In the fabrication of integrated circuits, barrier layers are required to prevent diffusion of metals into semiconductors such as silicon. In order to make reliable electrical contacts, a common approach is to first deposit a thin layer of a material that is electrically conductive and also blocks diffusion of the metal. TiN has a good electrical conductivity and TiN thin films function well as a diffusion barrier material for silicon integrated circuits.

Future generations of integrated circuits will require much higher integration densities with sub-micron features. Conformal low temperature deposition of TiN barrier layers on nanometer scale features with high aspect ratios is desired for future generations of integrated circuits. TiN is typically deposited by sputtering, but this line-of-site technique cannot provide adequate step coverage on this dimension. Chemical vapor deposition (CVD) provides much better conformal coatings. The temperature used for CVD of TiN for this application should be below 350° C. CVD of TiN involves both gas phase and surface reactions.

Initial attempts at CVD of TiN with titanium amido precursors did not use $NH_3$ and found severe carbon contamination in the films. When a titanium amido precursor is used alone to deposit TiN, the resulting material is severely contaminated with carbon. In order to produce low carbon, low resistivity TiN thin films from a titanium amido precursor, reaction with ammonia $NH_3$, is used. Two chemistries have been demonstrated for the CVD of TiN thin films for microelectronics: 1) titanium tetrachloride ($TiCl_4$) and ammonia ($NH_3$) and 2) tetrakis dialkylamido titanium (Ti$(NR_2)_4$) and $NH_3$ ammonia, where R is an alkyl constituent, e.g. Ethyl (Et=$C_2H_5$) or Methyl (Me=$CH_3$). These two CVD processes both react a titanium precursor, $TiCl_4$ or Ti$(NR_2)_4$, with $NH_3$. Gas phase reaction between Ti$(NMe_2)_4$ and $NH_3$ occurs rapidly even at 25° C. to produce $HNMe_2$. Solution chemistry shows that transamination reactions between Ti$(NR_2)_4$+4$HNR'_2$ occur readily to form Ti$(NR'_2)_4$+ 4$NR_2$, where R and R' are different alkyls. Isotopic labeling demonstrates that CVD systems using deuterated ammonia ($ND_3$) in the formation of TiN produces $DNMe_2$. A gas phase transamination reaction occurs which explains the need for $NH_3$ to produce low carbon films. Reaction with $NH_3$ effectively removes $HNMe_2$ from the precursor thereby reducing carbon incorporation into TiN presumably through the formation of a reactive intermediate that decomposes on the surface.

The chloride process is not widely accepted due to concerns about the required high temperature and chloride contamination. Another important consideration is the step coverage, that is, the ability to conformally coat the side walls and bottoms of microstructures including steps, trenches and vias. Although the chloride reaction gives excellent step coverage, the temperature requirement is too high for this application and chlorine contamination is a problem as well. The step coverage is not as good from the amido reaction but it gives TiN at the required temperature. Improving the step coverage of this process improves development of integrated circuits. The metal organic processes may overcome contamination problems and step coverage limitations of current TiN CVD processes. The Ti$(NMe_2)_4$, (TDMAT) and $NH_3$ (ammonia) CVD TiN thin film processes are known to produce poor film quality due to poor adhesion and step coverage. U.S. Pat. Nos. 5,139,825, 5,178,911, 5,254,499, 5,192,589, 5,246,881, teach chemical vapor deposition processes for transition metal nitrides including the TDMAT and ammonia process for forming TiN thin films.

The reaction of tetrakis diethylamido titanium Ti$(NEt_2)_4$ (TDEAT) with $NH_3$ is known to produce more stable TiN films with better step coverage and adhesion than TDMAT with $NH_3$. Step coverage is predominantly controlled by the sticking coefficient of the molecule reacting with the surface. Molecules with low sticking coefficients can survive numerous collisions with the side walls of a via to react with the bottom and hence will give better step coverage. The large rate constant for TDMAT means that it will be completely reacted and converted into an intermediate that may have a large sticking coefficient. In the case of TDEAT, the rate constant is much smaller, the extent of reaction is much less and intermediates with smaller sticking coefficients could be formed. Film quality as a function of temperature and ammonia pressure are consistent with the reactivity of TDMAT and TDEAT. With TDEAT, the resistivity of TiN decreases with increasing temperature and ammonia pressure. Similarly, the step coverage decreases with increasing temperature and ammonia pressure. As either temperature or ammonia pressure is increased, reaction between TDEAT and ammonia becomes more extensive. Transamination reaction is required to remove carbon and form low resistivity films. However, with more extensive reaction, intermediates with higher sticking coefficients are formed and hence reduced step coverage is observed.

The reaction rate of Ti$(NEt_2)_4$ with $NH_3$ is much slower than for Ti$(NMe_2)_4$ with a difference in film properties. The relative rate constants for Ti$(NMe_2)_4$ and Ti$(NEt_2)_4$ with $NH_3$ at 85° C. are $k_{Me}/k_{Et}$=155. Ti$(NEt_2)_4$ provides better quality TiN films than Ti$(NMe_2)_4$. The reaction of Ti$(NEt_2)_4$ with $NH_3$ is much slower generating improved film properties indicating that, by controlling the reaction rates, it may be possible to control the step coverage and other properties of TiN. The large rate constant for Ti(NMe$_2$)$_4$ means that, under CVD conditions, it will be completely reacted and may be converted into an intermediate that has a large sticking coefficient. In the case of Ti(NEt$_2$)$_4$ the rate constant is much smaller, the extent of reaction is much smaller and intermediates with smaller sticking coefficients could be formed. Thus, there exists a need to improve the control of reaction rates of titanium precursors in CVD systems to produce better quality TiN films. TiN films produced with Ti(NMe$_2$)$_4$ are unacceptable with high resistivity, poor step coverage and morphology. The rate of reaction of Ti(NMe$_2$)$_4$ with NH$_3$ is disadvantageously too fast and leads to the formation of intermediates with high sticking coefficients or low surface mobility. These and other disadvantages are solved or reduced using the present invention.

SUMMARY OF THE INVENTION

An object of this invention is to provide a method for controlling the transamination reactions during chemical vapor depositions using metal-amido precursors.

Another object of this invention is to provide a method for controlling the reaction rate of metal-amido precursors during the formation of metal based materials.

Yet another object of the present invention is to provide a method for controlling the reaction rate of metal-amido precursors during gas phase reactions by the addition of excess amine created during transamination reactions generating the amine as a product.

Still another object of object of the present invention is to provide a method for controlling the reaction rate of a titanium-amido precursor and an ammonia reagent during gas phase reactions by the addition of excess amine created during reversible transamination reactions generating the amine as a product during chemical vapor deposition of a titanium based thin film.

A further object of the present invention is to provide a method for controlling the reaction rate of a tetrakis dimethylamido titanium precursor and an ammonia reagent during a gas phase reaction by the addition of excess dimethylamine created during the reaction generating dimethylamine as a product during chemical vapor deposition of a titanium nitride thin film.

The present invention is a method of controlling the rate of reaction of a metal-amido precursor and an amine reagent having a reversible initial transamination reaction producing an dialkylamine inhibitor which when added to the reaction controls the rate of the reaction. A transamination reaction is the reaction of an amido precursor with an amine reagent forming a new amido compound and a dialkylamine. A transamination reaction of the metal-amido precursor and the amine reagent produces a dialkylamine inhibitor. The metal amido is M$_x$(NR$_2$)$_y$ where M is the metal, X is the number of metal atoms, Y is the number of bonded amido constituents, NR$_2$ is an amido group having an alkyl group R. The dialkylamine inhibitor is a product of the initial transamination reaction and an excess amount of the inhibitor when added during the gas phase reaction controls the rate of the reaction.

The preferred form of the present invention is specifically directed to gas phase kinetics and chemical vapor deposition of TiN thin films. The gas phase reaction of Ti(N(CH$_3$)$_2$)$_4$ Tetrakis dimethylamido titanium (TDMAT) and ammonia NH$_3$ reagent results in a reversible initial transamination reaction producing dimethylamine, HN(CH$_3$)$_2$, (DMA) which when additional amounts are added to the reaction, inhibit the reaction to thereby control the rate of reaction. The reaction leads to the production of TiN thin films but at a controlled rate with improved coverage of fine features of an underlying substrate. TDMAT is the preferred metal-amido precursor. Titanium, Ti, is the preferred metal, methyl, CH$_3$, is the preferred alkyl R, ammonia NH$_3$ is the preferred amine reagent, and dimethylamine HN(CH$_3$)$_2$ DMA is the preferred dialkylamine inhibitor. TDMAT has a higher vapor pressure than TDEAT. TDMAT provides a sufficient partial pressure from conventional bubblers.

The gas phase chemistry and the properties of materials produced under this preferred chemical vapor deposition method results in the production of TiN thin films at a controlled rate. The preferred process uses methyl CH$_3$. The preferred process is based upon the reversible initial transamination reaction: Ti(N(CH$_3$)$_2$)$_4$+NH$_3$=((CH$_3$)$_2$N)$_3$Ti(NH$_2$)+HN(CH$_3$)$_2$. The reaction rate of the Ti(N(CH$_3$)$_2$)$_4$ TDMAT precursor with ammonia NH$_3$ reagent is inhibited by the addition of excess dialkylamine, HN(CH$_3$)$_2$ DMA. The addition of gas phase dimethylamine DMA provides the means to control the reaction of tetrakis dialkylamidotitanium precursor with the ammonia reagent to deposit TiN thin films. The present invention is applicable to related nitride materials. These and other advantages will become more apparent from the following detailed discussion of the preferred embodiment.

DETAILED DESCRIPTION OF THE PREFERRED EMBODIMENT

Figure 1:
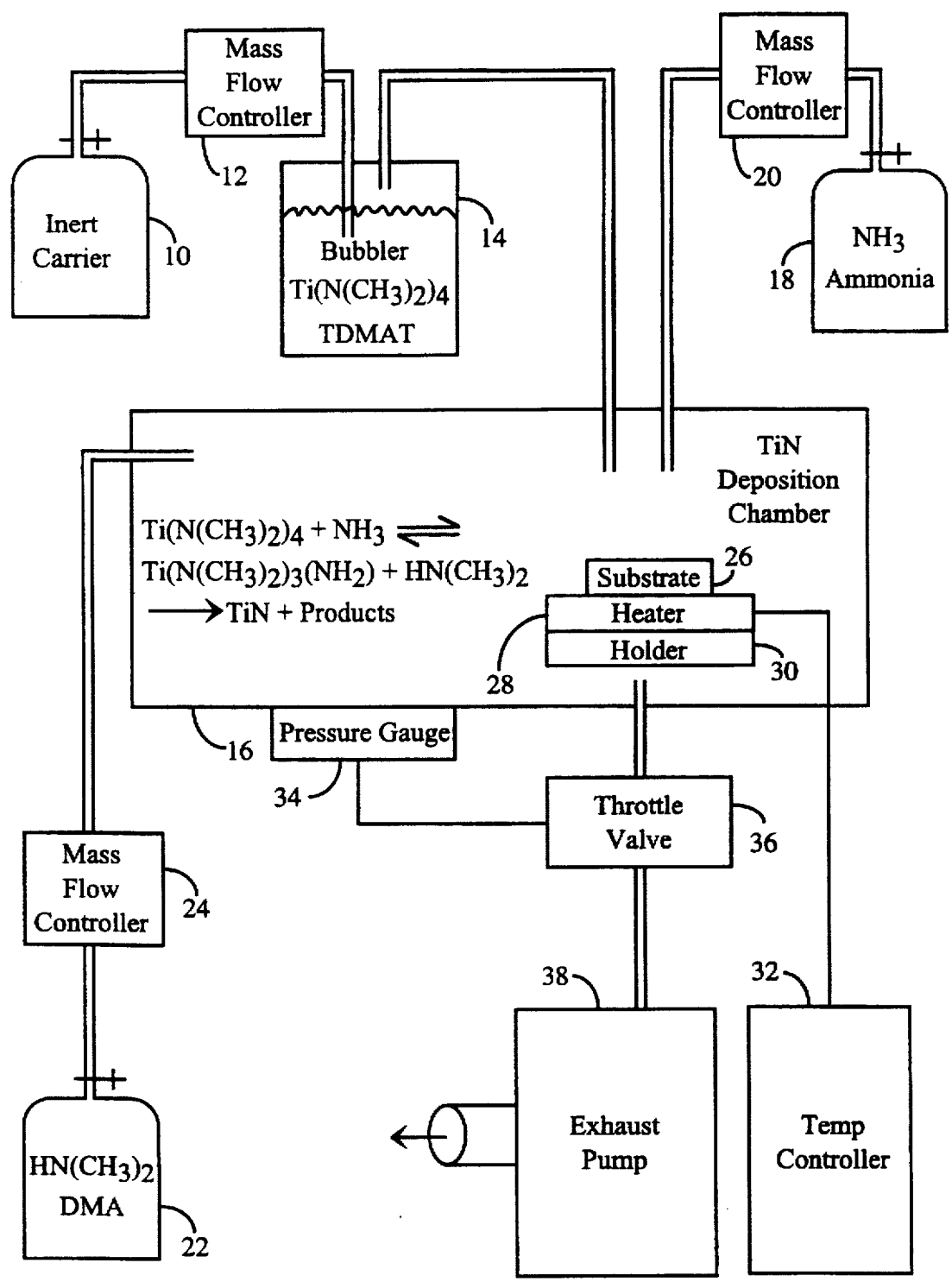
FIG. 1 is a block diagram of a titanium nitride thin film deposition system.

A preferred embodiment of the present invention is described with reference to the figures using reference designations as shown in the figures. Referring to FIG. 1, an inert carrier gas source 10 provides an inert carrier gas through a mass flow controller 12 to a bubbler 14 containing Ti(N(CH$_3$)$_2$)$_4$, tetrakis dimethylamido titanium (TDMAT) to mix the inert carrier gas with the TDMAT providing a partial pressure TDMAT precursor gas to a TiN deposition chamber 16. An NH$_3$ ammonia source 18 provides ammonia gas through another mass flow controller 20 providing a partial pressure ammonia reagent gas to the chamber 16. The ammonia gas reacts with the precursor TDMAT gas in the chamber 16 in a gas phase reaction. This reaction includes an initial reversible transamination reaction Ti(N(CH$_3$)$_2$)$_4$+NH$_3$=Ti(N(CH$_3$)$_2$)$_3$(NH$_2$)+HN(CH$_3$)$_2$ which forms a product dimethylamine HN(CH$_3$)$_2$(DMA) within the chamber 16. A DMA source 22 provides DMA through another mass flow controller 24 providing additional partial pressure of DMA to the chamber 16. The additional partial pressure of DMA is used to control the rate of the transamination reaction which results in the formation of titanium nitride (TiN) and other products within the chamber 16. The chamber 16 preferably includes a substrate 26, heater 28 and a substrate holder 30 for depositing a titanium nitride thin film on the substrate 26. The heater 28 regulates the temperature of the substrate 26 and is controlled by an external temperature controller 32. Internal pressure within the chamber 16 is sensed by a pressure gauge 34 and controlled by a throttle valve 36 and an exhaust pump 38. The preferred embodiment is a chemical vapor deposition system employing a gas phase reaction for the deposition of a TiN thin film. The deposition rate is controlled by controlling the transamination reaction through the addition of regulated amount of the DMA inhibitor from the source 22. This system may be modified to deposit other films using other gases in an equivalent manner.

The present invention covers a method for controlling the gas phase transamination reaction of a metal-amido precursor and an amide reagent producing a dialkylamine product which is the same chemical specie added to the reaction to control the reaction as an inhibitor. The transamination reaction between a metal amido compound and ammonia is reversible and applicable to the chemistry of amido compounds and particularly for the CVD of TiN. For example, the use of amine inhibitor provides a method for controlling the extent of gas phase reaction and therefore the properties of TiN. Amido precursors are useful for the CVD of many nitride materials. The metal amido is $M_x(NR_2)_y$, where M is the metal, e.g. titanium, X is the number of metal atoms, Y is number of amido constituents, e.g., $NR_2$ is the amido group having an alkyl R, e.g. methyl (Me)$CH_3$. The inhibitor is a product of the transamination reaction, e.g $HN(CH_3)_2$ (DMA). The amine reagent includes, for example, ammonia, deuterated ammonia, monoalkylamine, dialkylamine, and any other amine which produces a reversible transamination reaction with the metal-amido compound to produce a dialkylamine inhibitor. The method can be used in chemical vapor deposition chambers, as shown in FIG. 1, or in other type of chambers, including static cells or flow tube reactors, both not shown, but well known by those skilled in the art of gas phase reaction chemistry. Those skilled in the art know how to mix various buffer gases, create predetermined partial pressures, and control the temperature of gas phase reactions.

The chambers, static cells and flow tube reactors may be equipped with infrared spectrometers, not shown, for measuring composition of gases. Infra-red (IR) spectra can reveal the extent of TDMAT gas phase reaction with ammonia. The gas phase reaction between TDMAT and ammonia is normally too fast to be measured in the static cell. A flow tube reactor can be used for measurement of reaction rates of fast reactions. The gas phase kinetics of the reaction between TDMAT and ammonia can be measured using the flow tube reactor equipped with an IR spectrometer. In a static cell, IR spectra can be obtained for: 1) TDMAT alone; 2) after a few seconds of the addition of a mixture of the ammonia and a buffer gas; after no further reaction with ammonia; and 4) a reference sample of dimethylamine. In a flow tube reactor, IR spectra can also reveal the extent of TDMAT reaction with ammonia over short periods of time. IR spectra show a relatively intense $NC_2$ symmetric stretch at 950 $cm^{-1}$ as a good signature for TDMAT. This signature can be used to monitor the number density of TDMAT. IR spectra also shows the addition of ammonia from the ammonia bands at 968 $cm^{-1}$ and 932 $cm^{-1}$ and at 1628 $cm^{-1}$. IR spectra show the disappearance of TDMAT with increasing reaction time. IR spectra also reveal the formation of DMA. The IR bands at 1156 $cm^{-1}$ and 730 $cm^{-1}$ are both for DMA, corresponding to methyl rock and a NH bend, respectively, and the IR band at 950 $cm^{-1}$ is the $NC_2$ stretch for TDMAT.

When an integrated intensity of the 950 $cm^{-1}$ band is plotted over time on a semi-log plot, a linear dependence is observed for a pseudo first order reaction. Pseudo first order conditions apply with an exponential decay for TDMAT: $[Ti(NMe_2)_4]=[Ti(NMe_2)_4]_0 exp(-k_1[NH_3]t)$, where $k_1$ is the bimolecular rate constant. A plot of the logarithm of the IR absorbance over the reaction time is linear: $ln(A/A_o)=-k_{obs}t$, $k_{obs}=k_1[NH_3]$, where A is the integrated absorbance of the TDMAT band, $A_o$ is the average integrated absorbance of the TDMAT band in the absence of $NH_3$, $k_{obs}$ is the observed decay constant, and t is time. The integrated absorbances A and $A_o$ are directly related to concentration. In a time dependent reaction, $A_o$ would be the absorbance at zero time. For time zero, the ammonia flow is substituted with buffer gas to provide the TDMAT absorbance for both the rates with and without the addition of excess DMA. The absorbance data is plotted as straight lines using a weighted least squares fit. The slopes of these lines equal the observed decay constants ($k_{obs}$) at each ammonia pressure. When the observed decay constants ($k_{obs}$) are plotted against ammonia pressure, a linear dependence is shown with a zero intercept for pseudo first order conditions. The reaction is rapid and produces DMA. The slope of the line gives the bimolecular rate constant $k_1=1.2\times10^{-16}$ $cm^3$/molecule-sec. The buffer gas, total pressure and flow velocity do not effect the reaction kinetics and the reaction rates.

The reaction mechanism of the transamination reaction of TDMAT with deuterated ammonia, $NH_3$, involves cleavage of an N—H bond. A significant kinetic isotope effect with deuderated ammonia results as a rate limiting step. When deuterated ammonia is used instead of ammonia, good pseudo first order kinetics result. The decay rate constants of using deuterated ammonia is reduced substantially from the ammonia value. The deuterated ammonia rate constant is $k_d=4.5\times10^{-17}$ $cm^3$/molecule-sec and the $k_1$ rate constant is $1.2\times10^{-16}$ $cm^3$/molecule-sec giving an isotope effect ratio of $k_H/k_D=2.4$. This indicates a primary isotope effect and that H atom transfer is involved in the rate limiting step of this reaction, which indicates that the amine proton in the product DMA originates from ammonia.

When TDMAT is reacted with ammonia in the presence of DMA, IR spectra reveal the effect of DMA on the reaction kinetics. The reaction time may be over an exemplar 0.60 seconds at 23° C. The partial pressure of DMA may be varied, e.g., between 0.0 and 0.3 torr, preferably at 0.198 torr, with the total and ammonia partial pressure is held constant, e.g. 0.46 torr. The pressure of TDMAT is preferably less than 0.006 torr. Reference spectra for ammonia acquired under similar conditions are used to subtract the IR spectral bands for ammonia. When the partial pressure of DMA is increased at constant ammonia pressure and flow conditions, the amount of TDMAT increases. When sufficient DMA is added to the gas stream, the reaction of TDMAT with ammonia can be almost completely inhibited over this time scale. The TDMAT+$NH_3$ reaction can be strongly inhibited by the addition of DMA.

Figure 2:
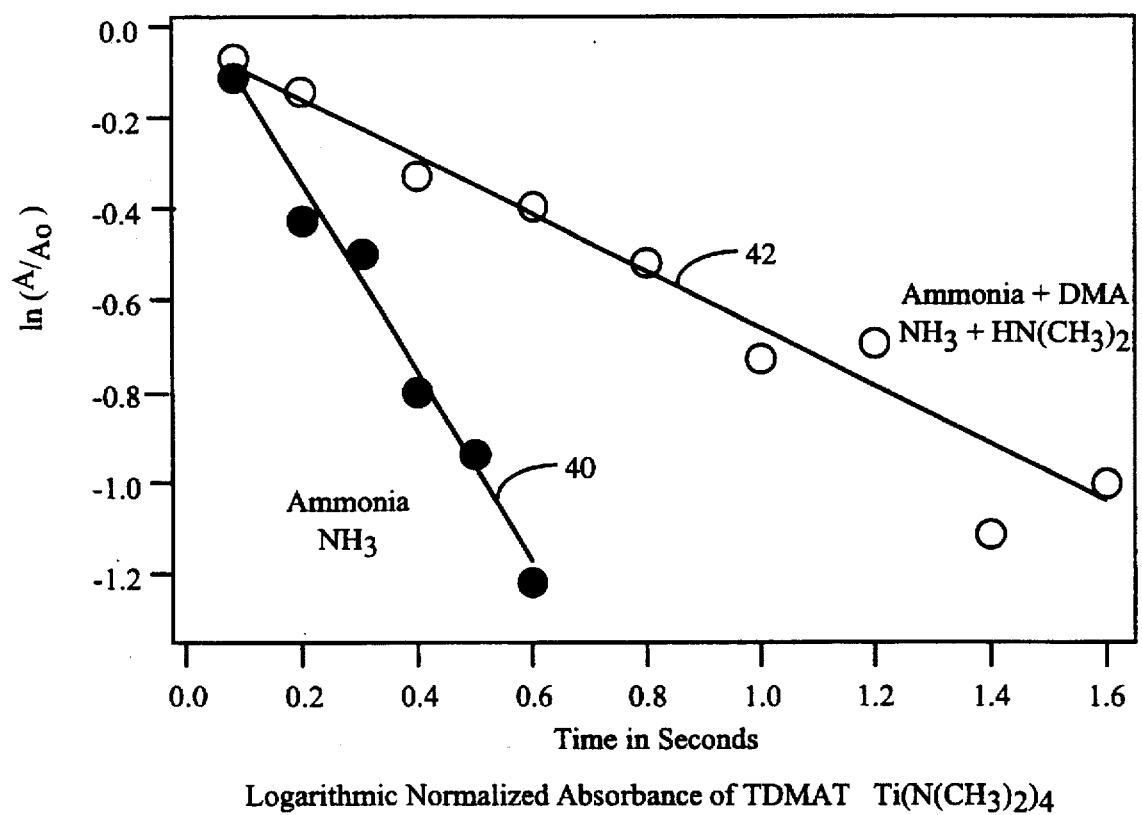
FIG. 2 is a graph of logarithmic normalized absorbance of tetrakis dimethylamido titanium (TDMAT) in the presence of ammonia, with and without added dimethylamine (DMA).

The decay rates of TDMAT with and without added DMA are shown in FIG. 2. The ammonia pressure is held constant at 0.46 torr and the data are plotted as $ln(A/A_o)$ over time. Pseudo first order conditions apply for both data sets and both semi log plots are linear. The rate constant ($k_1$) is calculated from the slope ($k_{obs}$) and the ammonia pressure where $k_{obs}=k_1(NH_3)$. In the absence of $HNMe_2$, the rate constant is $k_1=1.4\times10^{-16}$$cm^3$/molecule-sec. In the presence of 0.198 torr of DMA, the rate constant is reduced significantly to $k_1=0.43\times10^{-16}$$cm^3$/molecule-sec. Independent confirmation of this result may be obtained from examination the reaction rates of TDMAT with ammonia in a static cell. The addition of the DMA inhibitor significantly reduces the reaction rates.

The reaction between TDMAT and ammonia is rapid even at room temperature. When TDMAT is mixed with less than five torr of ammonia in a closed gas cell, the reaction is complete in less than five seconds. The gas phase DMA product can be identified and this is consistent with a transamination reaction between TDMAT and ammonia. This explains the importance of ammonia in the formation of low carbon TiN films, in that, carbon is removed from the starting material through the formation of DMA. The flow tube reactor can measure the kinetics of the gas phase reaction between TDMAT and ammonia.

This rate constant is relatively large and confirms quantitatively the rapid reaction between TDMAT and ammonia. For example, the rate constant indicates that in the presence of one torr of ammonia, the lifetime of TDMAT is one second at room temperature. The use of helium or argon buffer gas has no effect on the value of the rate constant demonstrating that the kinetics are not determined by mass transport. Under the CVD process conditions of high ammonia pressures and temperatures, extensive gas reactions do occur and TDMAT will be converted into a new species before it reaches the surface of the growing film.

The rate constant is independent of total pressure and the rate constant is valid for modeling systems under a range of pressures. When deuterated ammonia was used instead of ammonia, a normal isotope effect was observe which indicates that an N—H bond is broken in the rate limiting step of reaction. Given this rate limiting step of reaction, and the observation of dimethylamine as the direct product, the transamination reaction between TDMAT and ammonia is the rate limiting step of the reaction. The rate constant is assigned to the transamination of the first amido ligand since subsequent reactions should be fast.

The temperature dependence of the rate constant was determined and provides activation parameters for the rate constant: $\log(A)=-10.0$ and $Ea=8.1$ kcal/mol. This data is consistent with a reversible transamination reaction: $Ti(NMe_2)_4+NH_{3=Ti(NMe2)_3}(NH_2)+HNMe_2$. This accounts for the role of ammonia in the process, carbon in the precursor is removed by this reaction and thereby reduces carbon incorporation in the film. The activation entropy, $\Delta S=-19.0$ cal/mol-K, is consistent with the rate limiting step of transamination. The precision of the activation parameters is high and allows calculation of the rate constant over a wide range of temperatures. The activation energy is consistent with the activation energy for the deposition of TiN from TDMAT and ammonia under kinetically controlled conditions: $Ea=7.4$ kcal/mol. This is consistent with transamination as the rate limiting step in the deposition of TiN.

The reaction rate of tetrakis diethylamido titanium $Ti(NEt_2)_4$ (TDEAT) with ammonia can be measured. Due to low vapor pressure of TDEAT, the flow tube reactor may not be suitable, but a static cell reactor can be used. The static cell is evacuated to about $10^{-6}$ torr at a temperature of 85° C. The cell is supplied a mixture of 12.5% ammonia in helium to a pressure of 10.0 torr and allowed to reach thermal equilibrium. A reference ammonia IR spectrum may be taken prior to filling the cell with an aliquot of TDEAT. The ammonia is supplied for one second and subsequent spectra may be taken at 6.0 second intervals. The final pressure in the cell may be 2.72 torr with a ammonia partial pressure of 0.345 torr. Kinetics of TDEAT and ammonia may be determined by the infrared spectra for TDEAT in the static cell. The initial spectrum shows bands for TDEAT at 1005 cm$^{-1}$ and 881 cm$^1$ prior to the addition of ammonia. The second and subsequent spectra show the slow decay of the TDEAT bands and concomitant formation of diethylamine (DEA) at 710 cm$^{-1}$. Bands for ammonia were subtracted using reference spectra for ammonia. The intensity of the 1005 cm$^{-1}$ band of TDEAT can be used to monitor its kinetics. There is an exponential decay for pseudo first order removal of TDEAT by ammonia with decay constant of $k_{obs}=8.2\times10^{-2}$ sec$^{-1}$. When helium alone is used instead of the ammonia and helium mixture, no decay of TDEAT is observed. Assuming a linear dependence on ammonia pressure, the bimolecular rate constant $k_1$ the ammonia partial pressure of 0.345 Torr, can be calculated at $k_1=8.8\times 10^{-18}$ cm$^3$/molecule-sec. The rate constant for TDEAT can be compared to the rate constant for TDMAT. The ratio of rate constants is $k_{Me}/k_{Et}=155$. TDEAT reacts much more slowly than TDMAT.

The time required for mixing between the two reagents TDEAT and $NH_3$ may affect the kinetics. The rate of reaction between TDMAT and $ND_3$ in the static cell can be used to check for mass transport limited kinetics. The rate of TDMAT+$ND_3$ is much faster than that measured for TDEAT+$NH_3$. With the $ND_3$ pressure of 0.345 torr, the calculated decay constant for TDMAT is 0.43 sec$^{-1}$ at 24° C. compared to 0.082 sec$^{-1}$ for TDEAT+$NH_3$ at 85° C. When the reaction of TDMAT with $ND_3$ is measured in the static cell at room temperature, a fast reaction is observed with 67% reaction in six seconds and complete reaction is less than twenty seconds. The same reaction occurs at higher total pressure. The reaction of TDEAT with ammonia is not mass transport limited.

A normal isotope effect does not occur for TDEAT and the reaction rates using ND3 or $NH_3$ are equal. There is no apparent isotope effect. The lack of a TDEAT isotope effect is in contrast with the TDMAT results and probably reflects the structural differences between these two molecules. Steric effects are known to be important in the transamination reactions of $Ti(NR_2)_4$ compounds. When comparing the products from transamination reactions of TDMAT and TDEAT in solution, the most notable are the reactions of TDMAT and TDEAT with dipropylamine (n-$Pr_2NH$). Extensive reaction with TDMAT was observed but there was no reaction for TDEAT. Apparently the steric bulk in TDEAT is greater, that the reaction with n-$Pr_2NH$ is completely suppressed. These effects are at work in the reaction with ammonia. For TDMAT, there may be enough room for ammonia to approach the Ti center without significant hindrance and therefore the rate limiting step is H atom transfer. The fact that there is no isotope effect for the reaction with TDEAT indicates that the rate limiting step is different and does not involve H atom transfer. With the significantly more steric hindrance for TDEAT, approach of ammonia to the Ti center may be rate limiting in this reaction and would indicate the lack of an isotope effect. Hence, an isotope effect may or may not indicate a rate limiting transamination reaction.

The reaction rates can be controlled to control the CVD rate of metal nitrides. The slower rate for TDEAT indicates the reaction has a higher activation energy than TDMAT. The ratio of the TDMAT and TDEAT rate constants at 85° C. with the same pre-exponential factors provide a difference in activation energies of $Ea=3.6$ kcal/mol. The measured TDMAT activation of 8.1 kcal/mol provides an estimate of the TDEAT+$NH_3$ activation energy of 11.7 kcal/mol. This value is consistent with the value derived from TiN deposition from TDEAT and ammonia under kinetically limited conditions of $Ea=11.5$ kcal/mol. Transamination reactions are the rate limiting reaction for CVD of TiN thin films from TDEAT or TDMAT mixed with ammonia.

TDEAT or TDMAT precursors with the ammonia reagent provides CVD of TiN thin films. Using rate constant data, the extent of reaction for TDEAT and TDMAT under identical reaction conditions can be compared. At 85° C., the rate constants are, 37.0 and 0.24 torr$^{-1}$-sec$^{-1}$ for TDMAT and TDEAT respectively. The transamination reaction of TDMAT with ammonia can be controlled using DMA to provide a reaction rate similar to TDEAT with ammonia.

The present invention is a method providing metal-amido precursors and amine reagents reacting together producing a dialkylamine inhibitor during a reversible transamination reaction which can be controlled by the addition of excess inhibitor. This controlled reaction can be used for CVD of nitride thin films. Those skilled in the art may enhance, improve or modify the method and apply it for other purposes. However, those enhancements, improvements, modifications and other applications may nonetheless fall within the spirit and scope of the following claims.

What is claimed is:

1. A method of controlling a rate of a reversible transamination reaction in a gas phase for controlling the rate of deposition of a titanium nitride film, the method comprising the steps of, supplying a partial pressure of a precursor, the precursor is a member of the group consisting of tetrakis dimethylamido titanium and tetrakis diethylamido titanium, supplying a constant partial pressure of an ammonia reagent, supplying a partial pressure of an inhibitor, the inhibitor is a member of the group consisting of dimethylamine and diethylamine, the inhibitor is dimethylamine when the precursor is tetrakis dimethylamido titanium, the inhibitor is diethylamine when precursor is tetrakis diethylamido titanium, mixing the precursor, reagent and inhibitor together, the precursor and reagent reacting together in the reversible transamination reaction producing a dialkylamine product having a chemical composition equal to the inhibitor, the dialkylamine inhibitor is supplied in addition to the produced dialkylamine product, the inhibitor is supplied for controlling the rate of the reversible transamination reaction for controlling the rate of deposition of the titanium nitride film, and exposing a substrate to the reversible transamination reaction to deposit the titanium nitride film on the substrate.

2. The method of claim 1 further comprising the step of, carrying the precursor by an inert carrier gas into a mixing chamber prior to the mixing step.

3. The method of claim 2 further comprising the steps of, controlling the temperature of the precursor, reagent and inhibitor in the mixing chamber during the reversible transamination reaction to a constant temperature.

4. The method of claim 1 wherein the precursor is a tetrakis dimethylamido titanium gas at less than 0.006 torr partial pressure, the reagent is ammonia gas at a partial pressure of 0.5 torr, and the inhibitor is dimethylamine at a partial pressure of 0.198 torr during the gas phase reaction, the method further comprising the steps of, controlling the temperature of the reaction to 24° C., and carrying the tetrakis dimethylamido titanium gas in a helium gas carrier into a mixing chamber prior to the mixing step.

* * * * *